United States Patent
Hsu et al.

(10) Patent No.: US 6,395,584 B2
(45) Date of Patent: May 28, 2002

(54) METHOD FOR IMPROVING THE LIQUID DISPENSING OF IC PACKAGES

(75) Inventors: Chi-Hsing Hsu; Chin-Hsing Chung; Wen-Fu Hsu, all of Hsinchu (TW)

(73) Assignee: FICTA Technology Inc., Taipei (TW)

( * ) Notice: Subject to any disclaimer, the term of this patent is extended or adjusted under 35 U.S.C. 154(b) by 0 days.

(21) Appl. No.: 09/745,933

(22) Filed: Dec. 26, 2000

Related U.S. Application Data

(62) Division of application No. 09/217,622, filed on Dec. 22, 1998, now abandoned.

(51) Int. Cl.$^7$ ............................................. H01L 21/48
(52) U.S. Cl. ..................... 438/124; 438/126; 438/127; 29/841; 29/855; 29/856
(58) Field of Search ................................ 438/108, 109, 438/124, 126, 127, 110, 112; 29/841, 855, 856; 174/52.2

(56) References Cited

U.S. PATENT DOCUMENTS

| | | | |
|---|---|---|---|
| 5,037,779 A | 8/1991 | Whalley et al. ............ 438/126 |
| 5,289,039 A | 2/1994 | Ishida et al. ................ 257/796 |
| 5,817,545 A | 10/1998 | Wang et al. ................ 438/127 |
| 5,847,467 A | 12/1998 | Wills et al. ................. 257/789 |
| 5,883,430 A | 3/1999 | Johnson ...................... 257/706 |
| 5,904,505 A | 5/1999 | Hotta et al. ................ 438/124 |
| 5,923,958 A | 7/1999 | Chou .......................... 438/118 |
| 5,972,738 A | 10/1999 | Vongfuangfoo et al. .... 438/124 |
| 5,981,312 A | 11/1999 | Farquhar et al. ............ 438/112 |
| 6,000,924 A | 12/1999 | Wang et al. ................ 425/125 |
| 6,087,202 A | 7/2000 | Exposito et al. ............ 438/113 |

FOREIGN PATENT DOCUMENTS

JP      1-173731    *   7/1989

* cited by examiner

*Primary Examiner*—David L. Talbott
*Assistant Examiner*—Alonzo Chambliss
(74) *Attorney, Agent, or Firm*—Bacon & Thomas

(57) ABSTRACT

A flat plate mold with special treatment or a metallic flat plate mold is adopted to flatten the resin painted over on IC chips during package dispensing process, such that it is able to maintain a consistent flatness of the surface of IC products after dispensing for laser or ink marking. And heat sinks can be attached to the flat plate mold to increase the heat-dissipating rate of IC products after dispensing.

9 Claims, 7 Drawing Sheets

(3.1)

(3.2)

(3.3)

(3.4)

(4.1)

(4.2)

(4.3)

(5.1)

(5.2)

(5.3)

A-A cross-sectional view of Fig. 7A

METHOD FOR IMPROVING THE LIQUID DISPENSING OF IC PACKAGES

This is a divisional application of Ser. No. 09/217,622, filed Dec. 22, 1998, now abandoned, the entire disclosure of which is hereby incorporated by reference.

FIELD OF THE INVENTION

The present invention relates to an improvement of IC package, and more particularly to the use of a flat plate mold with special treatment during IC package dispensing process, such that it is able to improve the surface flatness of an IC product after dispensing; and a heat sink can be attached to the flat plate mold to improve the heat-dissipating problem of IC product.

BACKGROUND OF THE INVENTION

In traditional plastic ball grid array (PBGA) package dispensing process, the surface of an IC package is not so smooth as that of a molding process.

Please refer to FIG. 1, which shows the traditional manufacturing processes of a liquid encapsulated plastic ball grid array, and has steps as below:

(1.1) Preparation of a substrate 1
(1.2) Mounting IC chip 2(die attach)
(1.3) Bonding wire 3
(1.4) Dispensing liquid dam resin 4
(1.5) Filling liquid resin 5
(1.6) Mounting balls 6

Due to the surface tension of liquid resin 5, it is possible to form an arc or spherical shape on the surface of resin 5 after solidification. The non-flatness of the resin surface will directly affect the quality of laser marking or ink marking. Also in traditional IC package dispensing process, there. is no such a way of attaching heat sink. Therefore, the heat dissipation of a dispensing-type product will become a serious problem.

OBJECTS OF THE INVENTION

Therefore, one of the objects of the present invention is to adopt a flat plate mold with special coating treatment to flatten resin surface of IC package, such that the surface flatness of a dispensing-type IC product will be improved. The coating of flat plate mold is teflon or any other coatings which are hard to adhere with liquid resin. A vent or pin one dot is provided on the flat plate mold for venting away of liquid resin, solvent or diluent to avoid generation of voids. The pin one dot is used for recognition for a surface mount device. Therefore, after removing the flat plate mold, it is adapted to a marking process of the resin surface of IC package. A convex point will be formed on the resin surface simultaneously, which can be used as a marker for pin one dot.

Another object of the present invention is to adopt a metal flat plate mold, and in particular, to be designed with a heat sink. After the metal flat plate mold flattens the resin surface, the heat sink can contact with or approach to IC chip for heat dissipation. The metal flat plate is provided with a vent or pin one dot, and its inner surface can be treated by roughening or protruding process to increase the adhesion between heat sink and resin, and prevent from delamination.

A further object of the present invention is to adopt a flat plate mold structure with special design for the dispensing manufacturing of matrix array package (MAP). On the special flat plate mold, a vent or pin one dot has been provided for each IC in MAP respectively, to be adapted for the package of multiple chip modules (MCM) to increase the productivity of the process and raise the yield of the product.

DETAILED DESCRIPTION OF THE INVENTION

Figure 1:
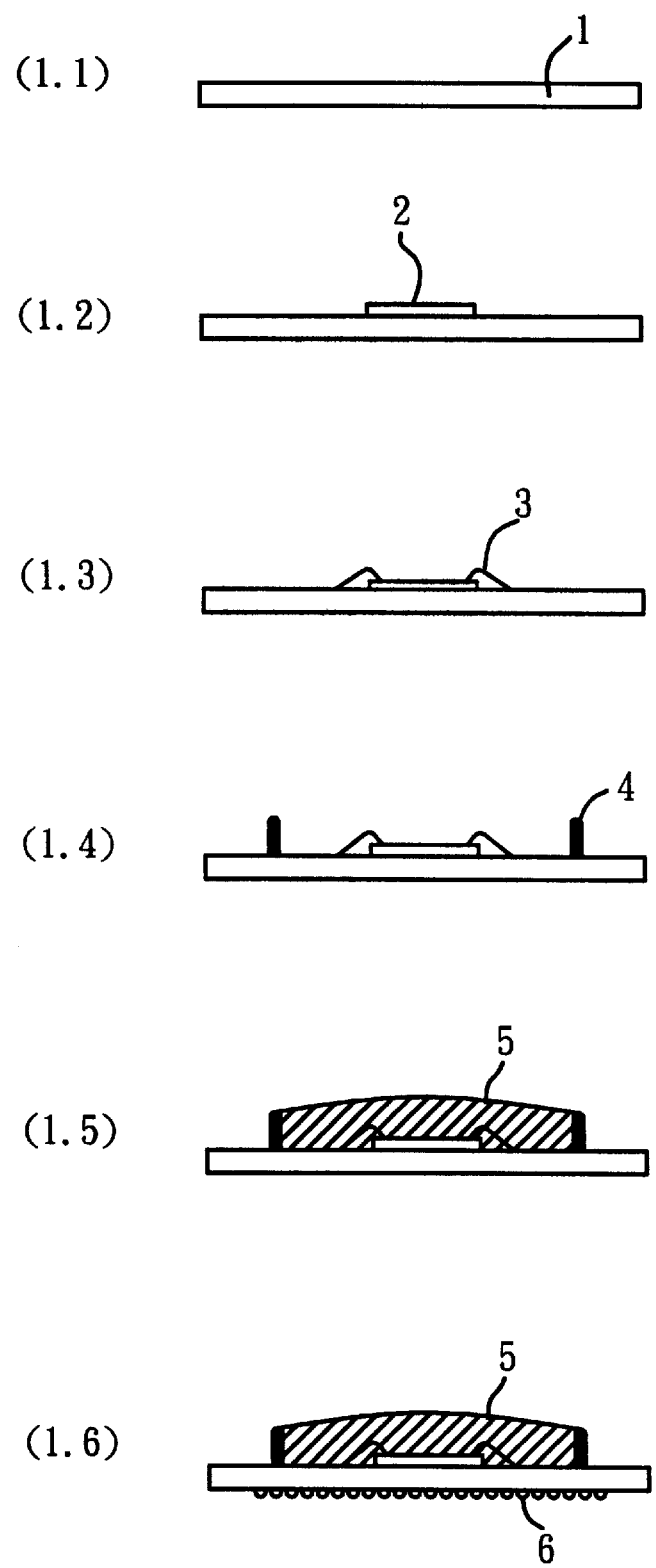
FIG. 1 is a process drawing of the formation of a traditional PBGA liquid dispensed package.
Figure 2:
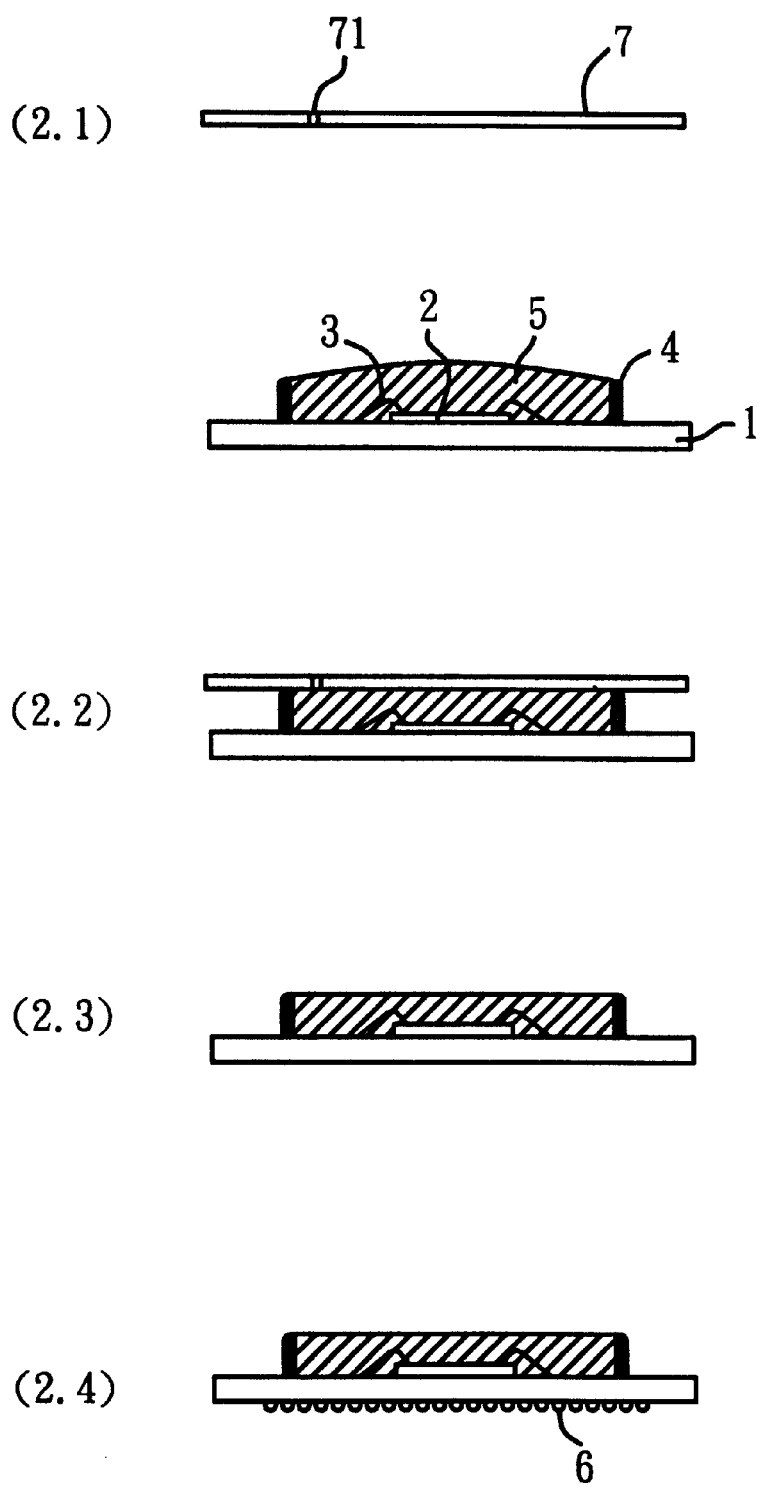
FIG. 2 is a process drawing of a first embodiment of the liquid dispensed package of the present invention.

Please refer to FIG. 2, it is a process drawing of a first embodiment of a liquid dispensed package of the present invention. After filling the thermosetting liquid resin 5 but before being solidified, a flat plate mold 7 with a special treatment surface is adopted (step 2.1) to flatten the resin 5(step 2.2). The flat plate mold 7 is pressed over on resin 5, and is provided with a vent 71 or pin one dot at proper position (we can design several air vents 71 if necessary), therefore it can smoothly vent away the extra resin 5 and air. After the resin 5 is solidified and the flat plate mold 7 is removed (step 2.3), a marker of pin one dot will be left on the resin surface. Finally, balls 6 are mounted on the back of the substrate 1(step 2.4). The shape of flat plate mold that fits with the shape of resin, can be circular or polygon. This method can be applied to flatten the epoxy resin of either cavity up or cavity down PBGA package.

Figure 3:
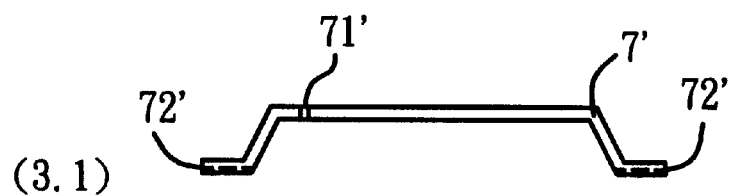
FIG. 3 is process drawing of a second embodiment of the liquid dispensed package of the present invention.
Figure 3:
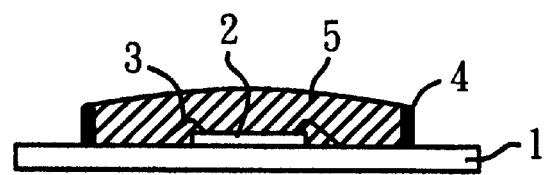
Figure 3:
Figure 3:
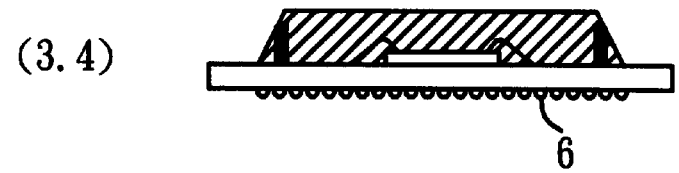

Please refer to FIG. 3, it is a process drawing of a second embodiment of a liquid dispensed package of the present invention. After filling the thermosetting resin 5 but before being solidified (step 3.1), a flat plate mold 7' with a special treatment surface is adopted to flatten the resin 5(step 3.2), but the flat plate mold 7' can be bent downward at the dam resin 4 to cover the substrate 1. The flat plate mold 7' is pressed over on resin 5, and is provided with an upper air vent 71' or pin one dot at proper position (we can design several air vents 71' if necessary); a lower side vent 72' is provided at where the flat plate mold 7' being bent downward to cover the substrate 1 (we can design several air vents 72' if necessary), therefore extra resin 5 and air can be vented out smoothly, and resin 5 can be formed according to the shape of the flat plate mold 7'. After the resin 5 is solidified and the flat plate mold 7 is removed (step 3.3), a marker of pin one dot will be left on the resin surface. Finally, balls 6 are mounted on the back of the substrate 1 (step 3.4). The shape of flat plate mold that fits with the shape of resin, can be circular or polygon.

Figure 4:
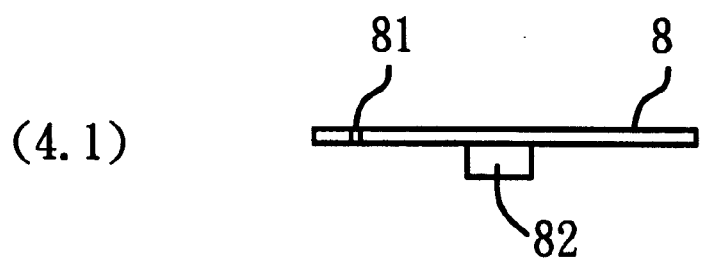
FIG. 4 is a process drawing of a third embodiment of the liquid dispensed package of the present invention.
Figure 4:
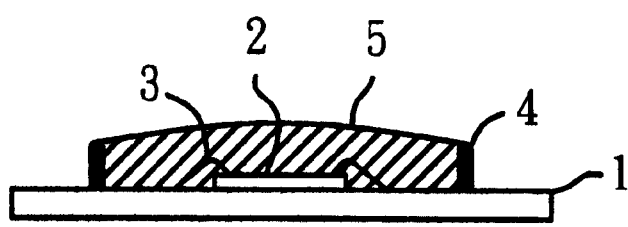
Figure 4:
Figure 4:
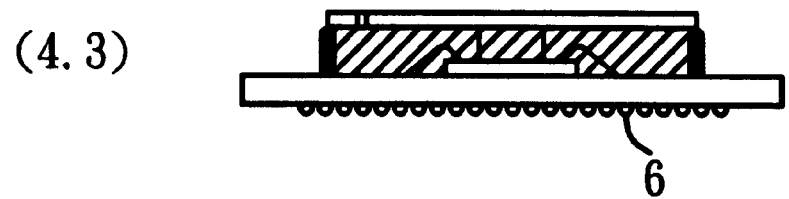
Figure 7A:
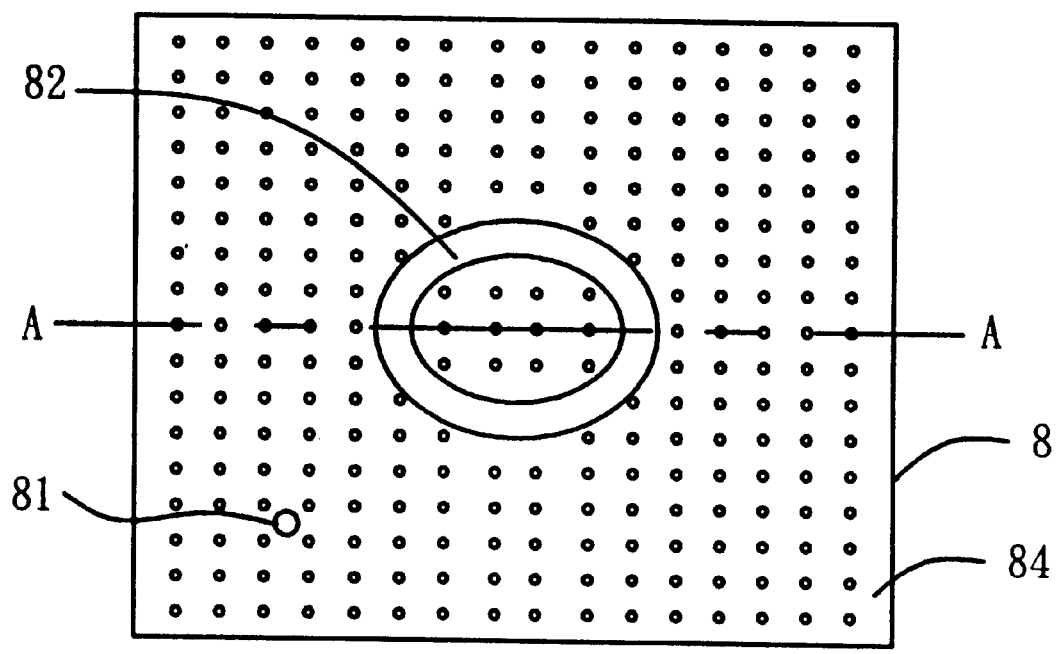
FIG. 7A and FIG. 7B are schematic views of the inner surface on the flat plate mold after roughening or protruding treatment of the present invention.
Figure 7B:
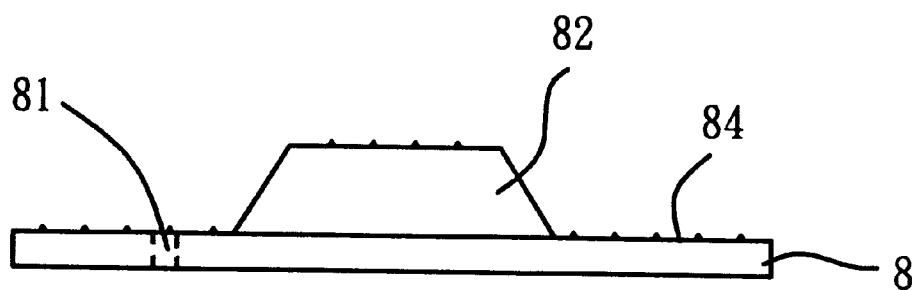

Please refer to FIG. 4, which is a process drawing of a third embodiment of liquid dispensed package of the present invention. After filling the thermosetting resin 5 but before being solidified, a flat plate mold 8 that is designed to have a metal heat sink 82 (step 4.1), is adopted to cover the resin 5 (step 4.2). The flat plate mold 8 is provided with a vent 81 or pin one dot at proper position (we can design several air vents 81 if necessary) to smoothly vent away the extra resin 5 and air. Resin 5 can be formed according to the shape of the flat plate mold 8. The heat sink 82 is formed integrally or adhered with the flat plate mold 8, and both are made of the same metal; the position of the heat sinks 82 is just corresponding to the IC chip in the resin 5. When the flat plate mold 8 is pressed closely over the resin 5, the heat sink 82 is just contacted or is very close to the IC chip 2, therefore it will enhance the heat dissipation of the IC chip 2. An inner surface 84 of the flat plate mold 8 is roughened or by protruding treatment (see FIG. 7A and FIG. 7B) to enhance the adhesion between flat plate mold 8/heat sink 82 and resin 5, and prevent from delamination. The flat plate mold 8 remains on the resin 5, then balls 6 are mounted on back of the substrate 1 (step 4.3). The shape of flat plate mold that fits with the shape of resin, can be circular or polygon. This method can be adapted for the package flattening of a cavity up or cavity down of an IC package.

Figure 5:
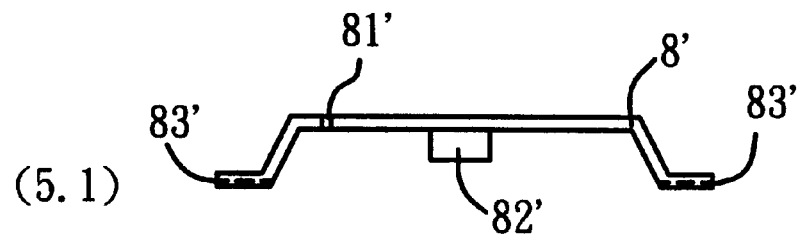
FIG. 5 is a process drawing of a fourth embodiment of the liquid dispensed package of the present invention.
Figure 5:
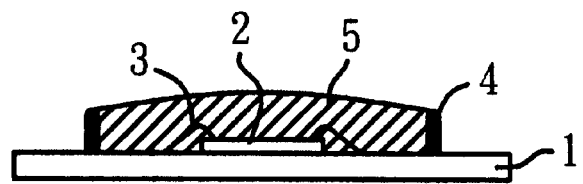
Figure 5:

Please refer to FIG. 5, it is a process drawing of a fourth embodiment of a liquid dispensed package of the present invention. After filling the thermosetting resin 5 but before being solidified, a flat plate mold 8', which is designed to have a metal heat sink 82' (step 5.1), is adopted to cover the resin 5 (step 5.2). But the flat plate mold 8' is bent dowhward at dam resin 4 to cover the substrate 1. The flat plate mold 8' is provided with an upper air vent 81' or pin one dot at proper position (we can design several air vents 81' if necessary). A lower air vent 83' is provided at where the flat plate mold 8' being bent downward to cover the substrate 1 (we can design several air vents 83' if necessary), therefore extra resin and air can be vented out smoothly, and resin 5 can be formed according to the shape of the flat plate mold 8'. An inner surface 84 of the flat plate mold 8' is roughened or by protruding treatment (see FIG. 7A and FIG. 7B) to enhance the adhesion between flat plate mold 8'/heat sink 82' and resin 5, and prevent from stripping. The flat plate mold 8 remains. on the resin 5, then balls 6 are mounted on back of the substrate l (step 5.3). The shape of flat plate mold that fits with the shape of resin, can be circular or polygon.

Figure 6:
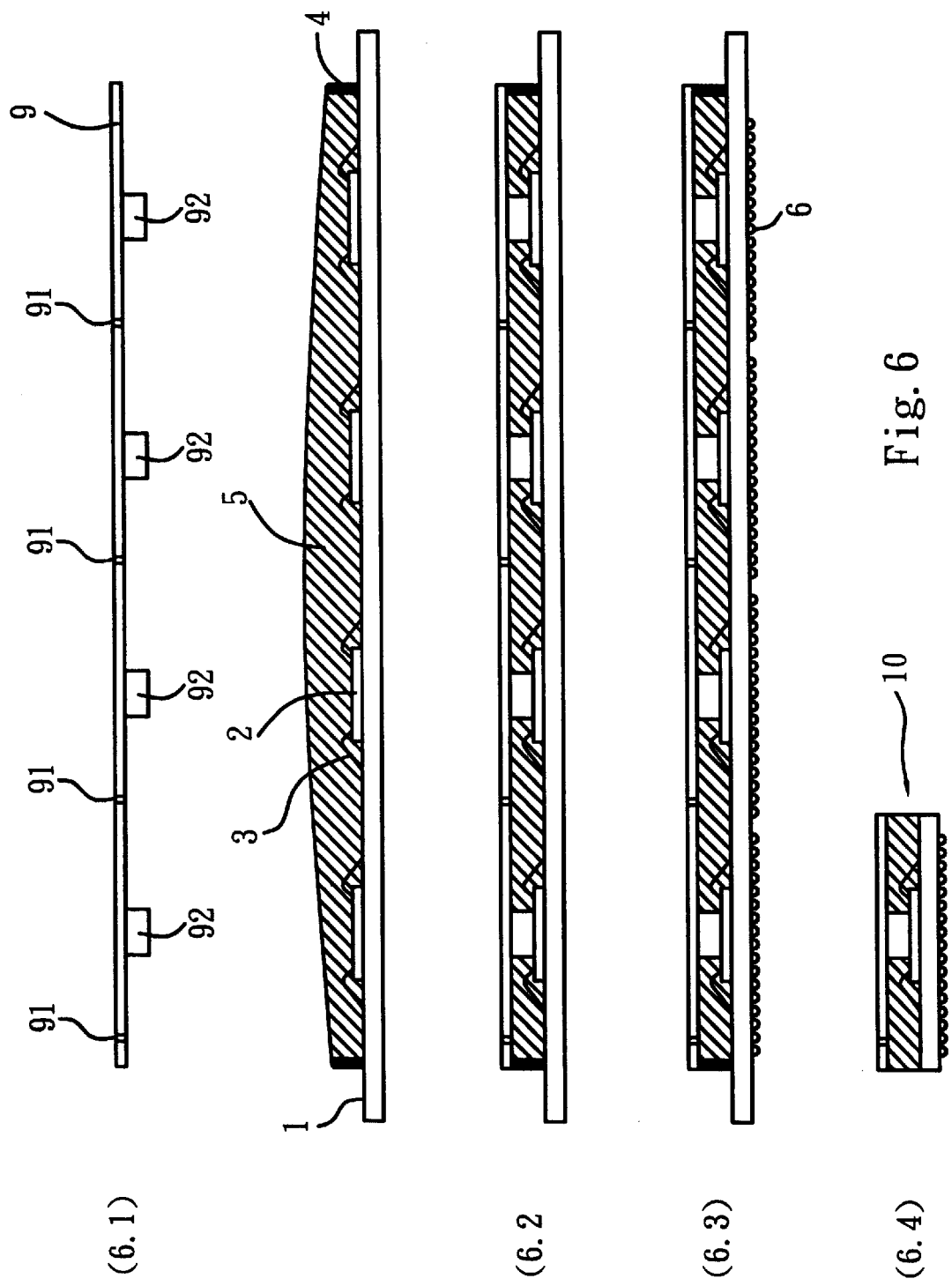
FIG. 6 is a process drawing of a fifth embodiment of the liquid dispensed package of the present invention.

Please refer to FIG. 6, it is a process drawing of a fifth embodiment of a liquid dispensed package of the present invention, which is used for manufacturing of a matrix array package (MAP) in the dispensing packages process, and adopts a flat plate mold 9 of special matrix array package (MAP) design for the liquid dispensed packing (step 6.1). After filling the thermosetting resin 5 on the matrix array packaged IC chips 2, but before being solidified, the special designed flat plate mold 9 is pressed over on the resin 5 (step 6.2). The flat plate mold 9 fits with those MAP IC chips 2, and is provided with a vent 91 or pin one dot respectively for each IC to smoothly vent away extra resin 5 and air. If the flat plate 9 is with special treatment (i.e. painted with a layer of teflon or any other coating which is hard to adhere with the liquid resin), it will be removed after the resin 5 is solidified. If the flat plate mold 9 is designed by metal, many heat sinks 92 are designed respectively for each IC chip 2, such that heat generated by each IC chip 2 can be smoothly vented away. These heat sinks can contact or approach the IC chip 2 (the one shown in FIG. 6 is a design of metal heat sink). An inner surface 84 of the flat plate mold 9 is roughened or by protruding treatment (see FIG. 7A and FIG. 7B) to enhance the adhesion between the flat plate mold 9/heat sink 92 and the resin 5 to prevent from delamination. Then, balls 6 are mounted on back of the substrate (step 6.3), and after sawing of the substrate, many individual IC packages 10 are obtained (step 6.4).

One skilled in this art can make various alterations without departing from the spirit and scope of the present invention after reading the present invention. Therefore, the appended claims are intended to embrace all these variations.

What is claimed is:

1. A method for improving the liquid dispensing of IC packages, during a liquid dispensed package process of an IC chip, said IC chip is mounted on a substrate, after forming a resin dam and filling liquid resin on said IC chip and said substrate but before being solidified, a flat plate mold having a shape fitting the shape of liquid resin on said IC chip and which is made of a metal and an air vent is provided at proper position of said flat plate mold, a surface of said flat plate mold is treated by roughening or protruding for pressing over said liquid resin on said IC chip tightly, to be used for flattening said liquid resin on said IC chip after dispensing and for heat dissipation; extra resin and air between said liquid resin and said flat plate mold can be vented away smoothly through said air vent; after said liquid resin is solidified, said flat plate mold remains on said resin for heat dissipation.

2. A method for improving the liquid dispensing of IC packages according to claim 1, wherein the circumference of said flat plate mold is bent downward and is able to cover said substrate on which said IC chip is mounted when said flat plate mold covers said resin; and an air vent is provided at where said circumference of said flat plate mold covers said substrate; to be used for flattening said liquid resin on said IC chip after dispensing and for heat dissipation.

3. A method for improving the liquid dispensing of IC packages according to claim 2, wherein a metal heat sink is provided at a surface of said flat plate mold pressed over said resin, and is formed integrally or adhered with said flat plate mold; when said flat plate mold is tightly pressed over said resin, said metal heat sink will be extended into said resin to contact or approach to said IC chip, thus said IC chip is easy to dissipate heat; a front surface of said metal heat sink is also treated by roughening or protruding.

4. A method for improving the liquid dispensing of IC packages according to claim 1, wherein a metal heat sink is provided at a surface of said flat plate mold pressed over said resin, and is formed integrally or adhered with said flat plate mold; when said flat plate mold is tightly pressed over said resin, said metal heat sink will be extended into said resin to contact or approach to said IC chip, thus said IC chip is easy to dissipate heat; a front surface of said metal heat sink is also treated by roughening or protruding.

5. A method for improving the liquid dispensing package of MAP IC chip, during a liquid dispensed package process of a matrix array package (MAP) IC chip, said MAP IC chip is mounted on a substrate, forming a resin dam and after filling liquid resin on said MAP IC chip and said substrate but before being solidified, a flat plate mold is designed to be fitted with many MAP IC chips on a substrate, such that each IC chip has a corresponding air vent respectively on the upper surface of said flat plate mold; and to be used for flattening the surface of said resin after filling said resin; extra resin and air between said liquid resin and said flat plate mold can be vented away smoothly through said air vents; after said liquid resin is solidified and said flat plate mold is removed, a marker of pin one dot for each IC chip according to the original position of each of said air vents will be left on the upper smooth surface of said resin; and then said MAP is sawed into many individual IC products.

6. A method for improving the liquid dispensing package of MAP IC chip, during a liquid dispensed package process of a matrix array package (MAP) IC chip, said MAP IC chip is mounted on a substrate and a resin dam is formed, after filling liquid resin on said MAP IC chip and said substrate but before being solidified, a flat plate mold made of a metal is designed to be fitted with many MAP IC chips on a substrate, such that each IC chip has a corresponding air vent respectively on and upper surface of said flat plate mold; and to be used for flattening the surface of said resin after filling said resin and for heat dissipation; extra resin and air between said liquid resin and said flat plate mold can be vented away smoothly through said air vents; after said liquid resin is solidified, said flat plate mold remains on said resin for heat dissipation, a marker for each IC chip according to the original position of each of said air vents will be left on upper surface of said flat plate mold; and then MAP is sawed into many individual IC products.

7. A method for improving the liquid dispensing package of MAP IC chip according to claim 6, wherein a metal heat sink is provided respectively for each IC at a surface of said flat plate mold pressed over said resin, and is formed integrally or adhered with said flat plate mold; when said flat plate mold is tightly pressed over said resin, said metal heat sinks will be extended into said resin to contact or approach to IC chips, thus IC chips are easy to dissipate heat; a front surface of said metal heat sink is also treated by roughening or protruding.

8. A method for improving the liquid dispensing of IC packages during a liquid dispensed package process of an IC chip comprising;

mounting said IC chip on a substrate;

forming a resin dam and then filling liquid resin on said IC chip and said substrate and before said resin solidifies;

placing a flat plate mold having a shape which fits the shape of liquid resin on said IC package and containing a coating which is hard to adhere with said liquid resin;

said mold containing an air vent at a proper position;

flatting said resin with said flat plate mold to flatten said resin;

venting extra resin and air between said liquid resin and said flat plate mold away smoothly through said air vent;

after said liquid resin is solidified;

removing said flat plate mold to leave a marker pin according to the original position of said air vent on the upper smooth surface of said resin.

9. A method for improving the liquid dispensing of IC packages according to claim 8, wherein the periphery of said flat plate mold is bent downward and is able to cover said substrate on which said IC chip is mounted when said flat plate mold covers said resin; and an air vent is provided in the upper portion of said flat plate adjacent the periphery of said flat plate.

* * * * *